United States Patent
Ali et al.

(10) Patent No.: US 10,778,148 B1
(45) Date of Patent: Sep. 15, 2020

(54) GAIN AND SENSITIVITY IN A GILBERT SWITCH STAGE

(71) Applicant: Raytheon Company, Waltham, MA (US)

(72) Inventors: Wais Ali, Waltham, MA (US); Ronald Tirado, Waltham, MA (US); Bryan Fast, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/713,422

(22) Filed: Dec. 13, 2019

(51) Int. Cl.
*H03D 7/14* (2006.01)
*H03F 3/45* (2006.01)

(52) U.S. Cl.
CPC ......... *H03D 7/1441* (2013.01); *H03D 7/1433* (2013.01); *H03F 3/45475* (2013.01)

(58) Field of Classification Search
None
See application file for complete search history.

(56) References Cited

U.S. PATENT DOCUMENTS

| | | | |
|---|---|---|---|
| 5,859,559 A | 1/1999 | Hong et al. | |
| 5,912,583 A * | 6/1999 | Pierson | H03H 11/0472 327/553 |
| 6,043,943 A * | 3/2000 | Rezzi | G11B 5/012 327/553 |
| 6,639,447 B2 | 10/2003 | Manku et al. | |
| 6,753,732 B1 * | 6/2004 | Moreland | H03F 3/45089 330/261 |
| 6,768,391 B1 | 7/2004 | Dent et al. | |
| 6,931,083 B1 | 8/2005 | Linder et al. | |
| 6,983,135 B1 * | 1/2006 | Tsai | H03D 7/1441 455/234.1 |
| 7,088,982 B1 | 8/2006 | Chien | |
| 7,847,613 B1 * | 12/2010 | Samavati | H03L 7/099 327/355 |
| 8,493,127 B1 * | 7/2013 | Yu | H03D 7/1441 327/356 |
| 8,836,407 B1 | 9/2014 | Soe et al. | |
| 9,350,297 B2 * | 5/2016 | Su | H03D 7/1441 |
| 2006/0094395 A1 | 5/2006 | Lee et al. | |

(Continued)

OTHER PUBLICATIONS

Xu, Q. et al., A Direct-Conversion Mixer with a DC-offset Cancellation for WLAN, 2007 IEEE Bipolar/BiCMOS Circuits and Technology Meeting (BCTM) 1.4, pp. 13-16.

(Continued)

*Primary Examiner* — Cassandra F Cox
(74) *Attorney, Agent, or Firm* — Burns & Levinson, LLP; Joseph M. Maraia

(57) ABSTRACT

A power detector with a main transconductance stage and a Gilbert switch stage coupled to one another. Current sources are coupled between the main transconductance and the Gilbert switch stages. Each of the current sources is configured to generate a cascoded PMOS trickle current under the control of a DAC to control the effective voltage of the Gilbert switch stage. This mitigates the DC offsets resulting in enhanced sensitivity of the Gilbert switch stage. An increase in the conversion gain of a system using a Gilbert switch stage, for a given LO swing, is therefore obtained for a very small increase in DC power.

19 Claims, 4 Drawing Sheets

(56) References Cited

U.S. PATENT DOCUMENTS

| | | | |
|---|---|---|---|
| 2008/0030244 A1* | 2/2008 | Leifso | H03B 19/14 327/122 |
| 2014/0162573 A1* | 6/2014 | Laskar | H04B 1/403 455/73 |
| 2020/0091608 A1* | 3/2020 | Alpman | H01Q 5/47 |

OTHER PUBLICATIONS

Long, Steve, Presentation on RFIC MOS Gilbert Cell Mixer Design, Agilent Technologies, Inc., Apr. 17, 2001, pp. 1-44, USA.

* cited by examiner

US 10,778,148 B1

GAIN AND SENSITIVITY IN A GILBERT SWITCH STAGE

GOVERNMENT RIGHTS

N/A

BACKGROUND

As is well known, a Gilbert switch pair produces a differential output signal that is proportional to two input signals. These switches are often used for frequency conversion in, for example, a radio system, as they provide an output current that is an accurate multiplication of the differential base currents of the two input signals. Further, as used in a mixer, this balanced operation cancels out many unwanted mixing products and provides a more accurate output.

In many applications, it is desirable to increase the conversion gain of the active mixer. In one known approach, the overall current of the mixer and the LO (Local Oscillator) drive are increased. This approach, however, can make it more difficult for the switches to switch and may have to increase the current quite a bit. An increase in the LO swing, which can switch the Gilbert switch harder, increases the gain but at the cost of increased DC power consumption which is an undesirable side effect.

What is needed, however, is a better approach to improving the gain and, therefore, the sensitivity of a Gilbert switch.

SUMMARY

In one aspect of the present disclosure, there is an apparatus, comprising: a main transconductance (MT) stage having an MT differential input port and first and second MT output paths; a Gilbert switch (GS) stage, coupled to the first and second MT output paths, comprising a GS differential input port and a GS differential output port; a first current source having an output coupled to the first MT output path; and a second current source having an output coupled to the second MT output path. At least one of the first and second current sources is configured to: generate a cascoded trickle current into the respective first or second output path as a function of an output of a DAC.

Another aspect of the present disclosure is directed to an apparatus, comprising: a main transconductance (MT) stage having an MT differential input port and first and second MT output paths; a Gilbert switch (GS) stage, coupled to the first and second MT output paths, comprising a GS differential input port and a GS differential output port; a first current source having an output coupled to the first MT output path; and a second current source having an output coupled to the second MT output path. Each of the first and second current sources is configured to generate a respective first and second trickle current at the respective current source output and introduce the generated first and second trickle current into the respective first and second MT output path. Further, each of the first and second current sources comprises: first and second PMOS transistors coupled in series between a supply rail and the respective output; and a DAC having an output coupled to a node between the first and second transistors.

In yet another aspect of the present disclosure, a power detector comprises: an input differential amplifier having a first differential input port and first and second output paths; an output differential amplifier having first and second differential pairs of transistors wherein common sources of the differential pairs of transistors are coupled to the first and second output paths, inputs of the differential pairs of transistors are cross-coupled to form a second differential input port and outputs of the differential pairs of transistors are cross-coupled to form a first differential output port; a load coupled to the first differential output port; a first current source having an output coupled to the first output path; a second current source having an output coupled to the second output path. Each of the first and second current sources is configured to generate a respective first and second trickle current at the respective current source output and introduce the generated first and second trickle current into the respective first and second output path. Further, each of the first and second current sources comprises: first and second transistors coupled in series between a supply rail and the respective current source output; and a DAC having an output coupled to a node between the first and second transistors.

In the foregoing aspects, an output of the DAC can source or sink current.

BRIEF DESCRIPTION OF THE DRAWINGS

Various aspects of the present disclosure are discussed below with reference to the accompanying figures. It will be appreciated that, for reasons of simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

Advantageously, aspects of the present disclosure provide an increase in the conversion gain of a Gilbert active mixer for a given LO swing for a very small increase in DC power. In addition to increasing the conversion gain, aspects of the present disclosure operate to mitigate the DC offsets that may be present in a main transconductance stage and/or a Gilbert switch stage of the Gilbert mixer resulting in enhancing the sensitivity of the active mixer.

The following description includes reference to mixer structures and Gilbert structures which are well understood by those of ordinary skill in the art. Accordingly, these structures will not be discussed in great detail. Reference is made to U.S. Pat. No. 5,859,559, which is incorporated by reference herein for all purposes, for background information.

Figure 1:
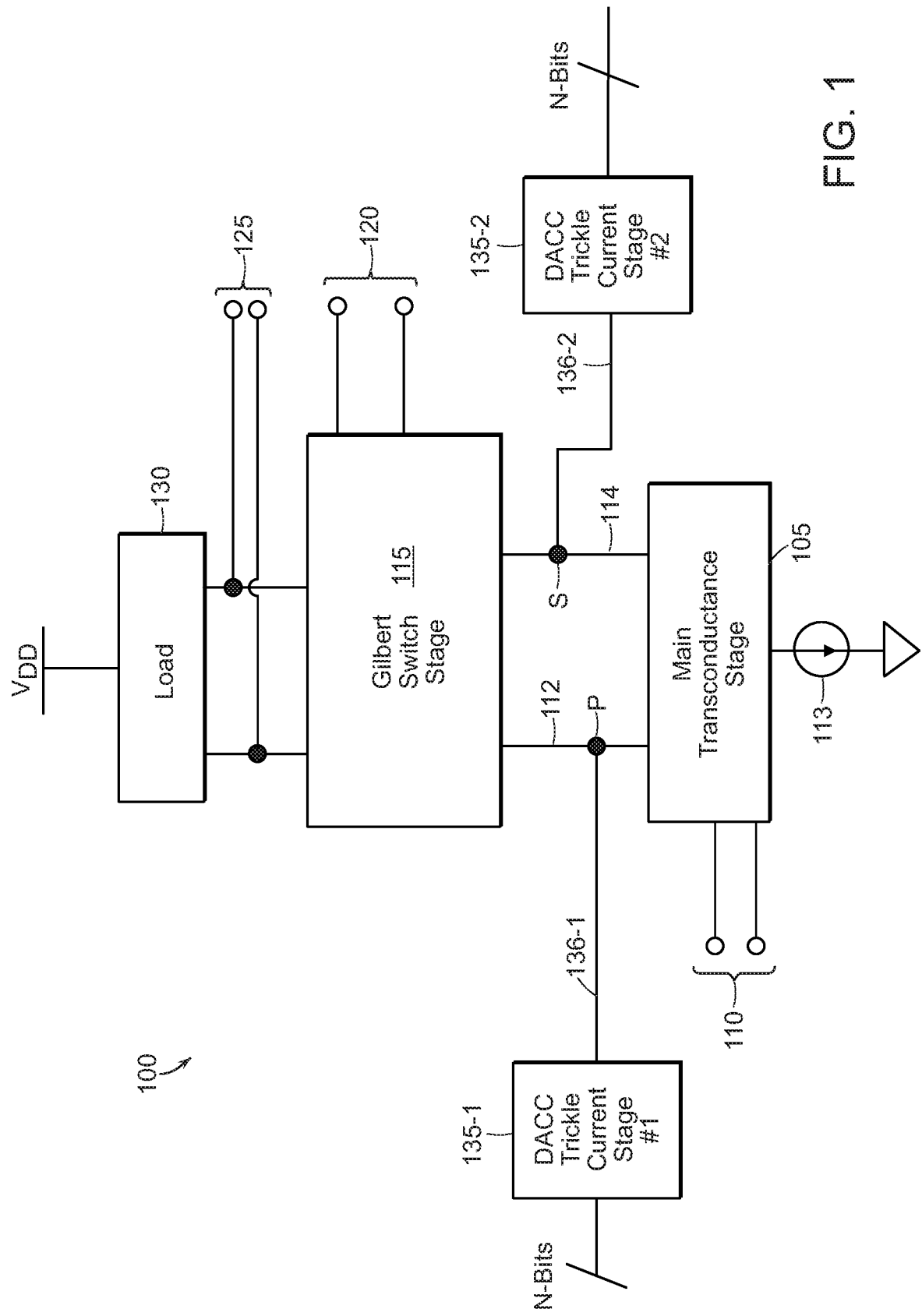
FIG. 1 is functional block diagram of a system in accordance with an aspect of the present disclosure.

Generally, and as will be described in more detail below, one aspect of the present disclosure is directed to, as a non-limiting example, an active Gilbert power detector system 100 as shown in FIG. 1. The system 100 includes an input differential amplifier, sometimes referred to as a main transconductance stage, 105 having an MT differential input port 110 and first and second output paths 112, 114. A current source 113 is coupled to the main transconductance stage 105. An output differential amplifier, i.e., a Gilbert switch stage, 115 is coupled to the main transconductance stage 105 via the first and second output paths 112, 114. The Gilbert switch stage 115 includes a switch stage differential input port 120 and a switch stage differential output port 125. A load 130 is coupled between the switch stage differential output port 125 and to a power supply VDD.

A first DAC-controlled (DACC) trickle current stage 135-1 has an output 136-1 coupled to the first output path 112 at a first node P and a second DACC trickle current stage 135-2 has an output 136-2 coupled to the second output path 114 at a second node S. As will be discussed in more detail below, each of the first and second DACC trickle current stages 135-1, 135-2 is configured to generate and introduce a respective first and second trickle current into the respective first and second output paths 112, 114.

Figure 2:
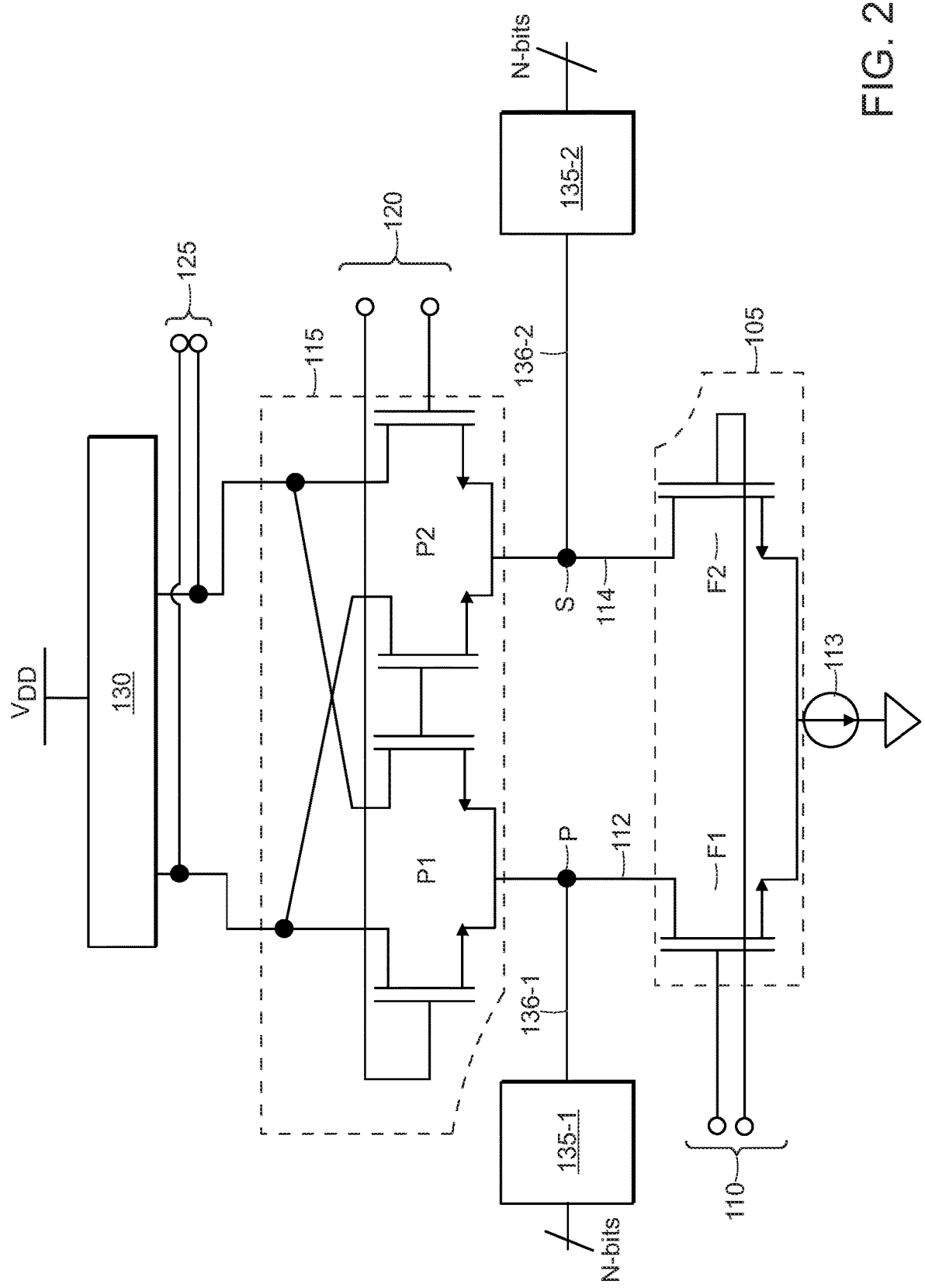
FIG. 2 is a schematic diagram of the system of FIG. 1.

Referring to FIG. 2, the main transconductance stage 105 includes two FETs F1, F2 with their sources coupled to the current source 113. The gates of the FETs F1, F2 comprise the MT differential input port 110. The Gilbert switch stage 115 includes first and second differential pairs of transistors P1, P2. As is shown, the common sources of the first differential pair P1 are coupled to the first output path 112 and the common sources of the second differential pair P2 are coupled to the second output path 114. The inputs of the differential pairs of transistors P1, P2 are cross-coupled to form the switch stage differential input port 120 and the outputs, i.e., the drains, of the differential pairs of transistors P1, P2 are cross-coupled to form the switch stage differential output port 125.

Figure 3:
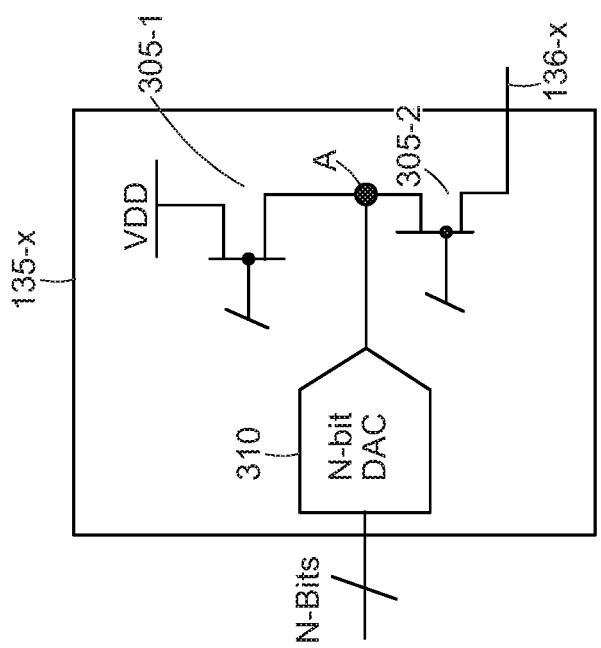
FIG. 3 is a schematic diagram of a portion of the system of FIG. 1.

Each DACC trickle current stage 135-1, 135-2 includes first and second PMOS FETs 305-1, 305-2 coupled in series, i.e., cascoded, with one another between the power supply VDD and the respective first and second output paths 112, 114, as shown in FIG. 3. An N-bit DAC 310 has its output coupled to a node A between the two FETs 305-1, 305-2. The DAC 310 is a two-way DAC in that it can both source and sink current at its output. Advantageously, as the DAC 310 is a single-line output device, it does not load down node A. In one non-limiting implementation, N=4, however, one of ordinary skill in the art will understand from this disclosure that the number of bits N can vary depending on the desired functionality.

Figure 4:
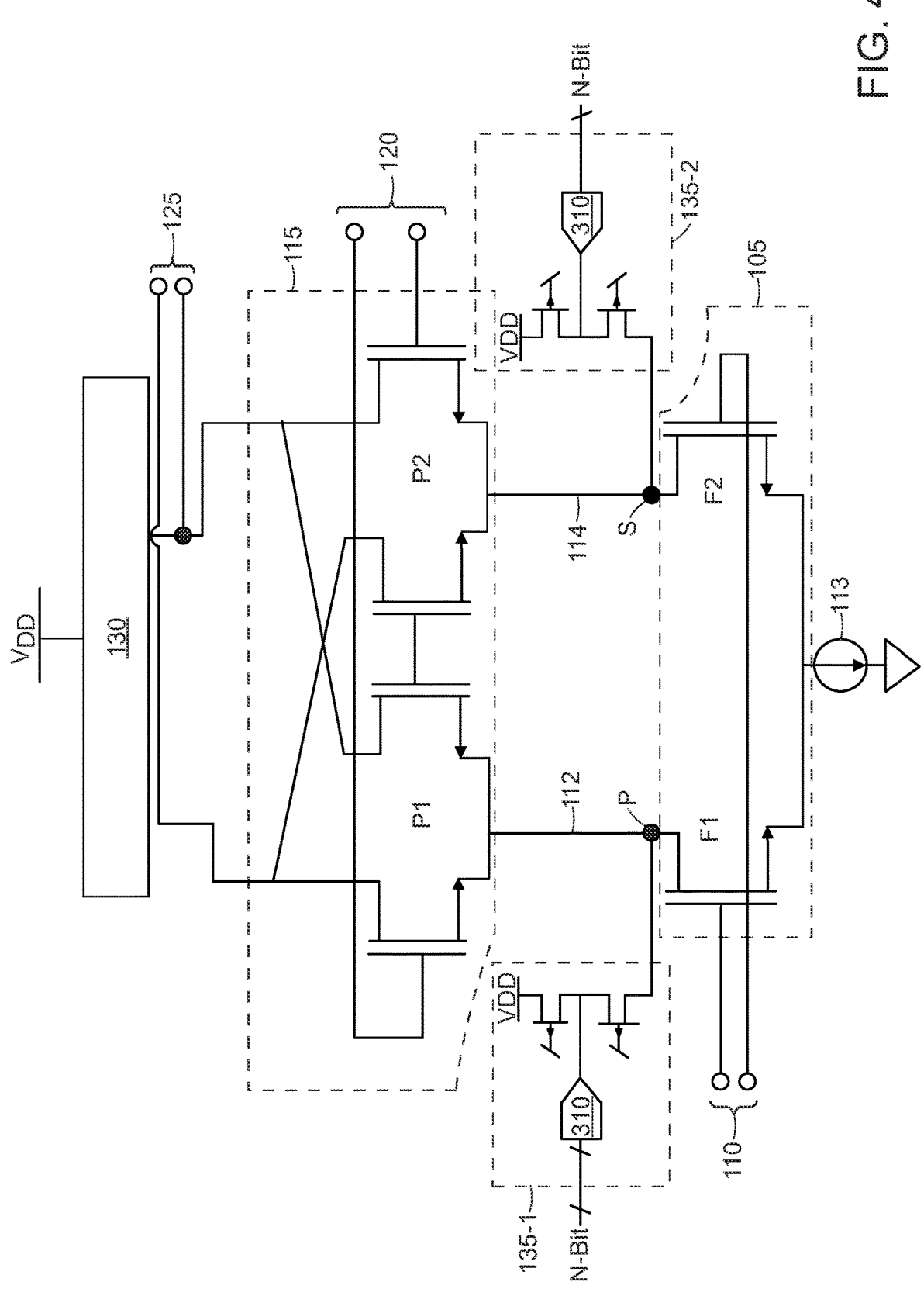
FIG. 4 is another schematic diagram of the system of FIG. 1.

All of the components of the system 100 are shown in FIG. 4.

Operation of the DACC stages 135-1, 135-2 will now be explained. Assuming, for explanatory purposes, that the DAC 310 is not present, the two FETs 305-1, 305-2 operate as a current mirror from a bandgap in another portion of the circuit (not shown and not germane to the present disclosure) to set a predetermined, i.e., a nominal amount of standing current. The DAC 310 is then operable to skew the current to be larger or smaller, i.e., each DAC 310 operates as an adjustment of the amount of current being injected or withdrawn as a function of its respective digital input.

Figure 5:
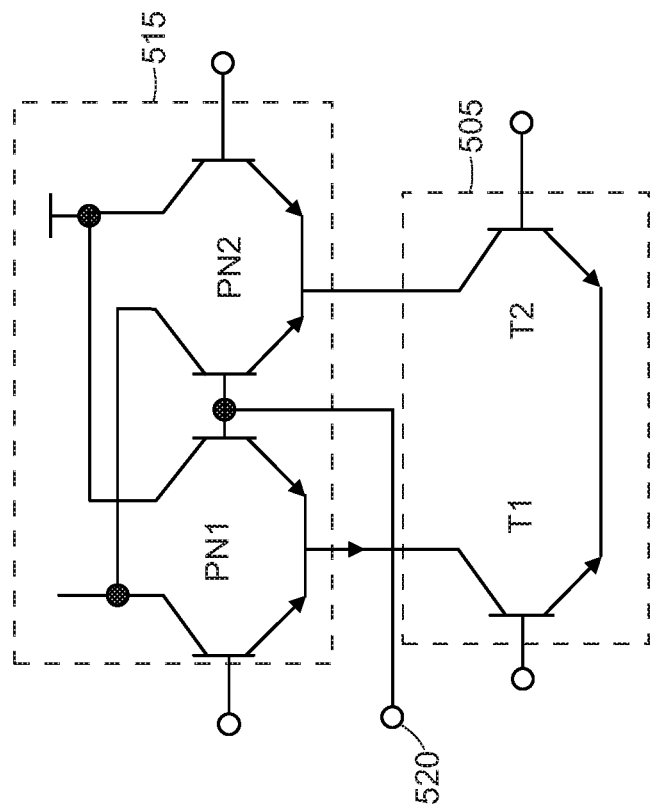
FIG. 5 is an alternate embodiment of a system in accordance with an aspect of the present disclosure.

Referring now to FIG. 5, in another embodiment of the present disclosure, a system can include a main transconductance stage 505 and a Gilbert switch stage 515 comprising NPN transistors in place of the transconductance stage 105 and the Gilbert stage 115, respectively. Accordingly, the transconductance stage 505 comprises NPN transistors T1, T2 and the Gilbert switch stage 515 is implemented with pairs of NPN transistors PN1, PN2 similarly configured as described above with respect to the transconductance stage 105 and the Gilbert stage 115. In addition, a node 520 is coupled to the coupled bases, as shown, to provide a bias voltage as is understood by one of ordinary skill in the art.

In operation, per an aspect of the present disclosure, by inserting a cascoded PMOS trickle current between the main transconductance stage 105, 505, and the Gilbert switch 115, 515, the effective voltage, Vgs–Vt of the Gilbert switch 115 or the ΔVbe of the Gilbert switch stage 515, can be controlled. Accordingly, the sensitivity of the Gilbert switch stage 115, 515 can be increased such that it will fully switch in response to a much lower LO drive.

It is known, to those of ordinary skill in the art, that the gain Gm of the system 100 is due to the contribution of both the main transconductance stage 105, 505 and the Gilbert switch stage 115, 515 where, for example, Gm is given by 2I/(Vgs–Vt), for the Gilbert switch stage 515. By adding a PMOS trickle current from the DACC stages 135-1, 135-2, the Gm of the main transconductance stage 105, 505 remains constant, but since the current into the Gilbert switch stages 115, 515 decreases, the LO drive (Vgs–Vt) of the Gilbert switch stage 115, 515, respectively, decreases. This decrease in the Vgs–Vt in the Gilbert switch stage 115, for example, allows the given LO to fully switch all the current in the Gilbert switch stage 115 which will result in an increase in the overall gain and sensitivity of the system.

It has been observed that if current is not trickled away, the higher current (I) injected into the Gilbert switch stage 115 will increase the Vgs–Vt in the Gilbert switch stage 115, resulting in a situation where a given LO swing might not fully switch all the current in the Gilbert switch stage 115, resulting in a lower gain than when the trickle current is being applied. As is known, the Vbe or Vgs–Vt of the Gilbert switch stage 515, 115, respectively, is integral in determining the gain and sensitivity of the Gilbert switch stage 515, 115. In addition, optimum operation is achieved when the Gm of the main transconductance stage 105, 505 is kept constant.

The digitally programmable DACs 310 in each DACC stage 135-x can be independently operated to trim out any DC offsets in the main transconductance stage 105, 505. Advantageously, by using the PMOS trickle current from the DACC stages 135-1, 135-2, overall gain and sensitivity can be optimized as it is known that DC offsets can affect the sensitivity of the overall circuit.

Further, the setting of the DACs 310 can be chosen by a user to provide for increased sensitivity while sacrificing, to some extent, an operating range or providing an extended operating range at the expense of sensitivity. Advantageously, the DACC stages 135-1, 135-2 provide this design flexibility. Still further, in one aspect of the present disclosure, the DAC 310 in the first DACC stage 135-1 need not have the same input as the DAC 310 in the second DACC stage 135-2. The ability to separately set the DACs 310 and, therefore, the respective trickle current, provides additional capability to compensate for any offsets that might be present in the system 100.

It is to be understood that the disclosure is not limited in its application to the details of construction and the arrangement of the components set forth herein or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

The present disclosure is illustratively described in reference to the disclosed implementations. Various modifications and changes may be made to the disclosed implementations by persons skilled in the art without departing from the scope of the present disclosure as defined in the appended claims.

What is claimed is:

1. An apparatus, comprising:
    a main transconductance (MT) stage having an MT differential input port and first and second MT output paths;
    a Gilbert switch (GS) stage, coupled to the first and second MT output paths, comprising a GS differential input port and a GS differential output port;
    a first current source having an output coupled to the first MT output path; and
    a second current source having an output coupled to the second MT output path,
    wherein at least one of the first and second current sources is configured to:
        generate a cascoded trickle current into the respective first or second output path as a function of an output of a DAC.

2. The apparatus of claim 1, wherein the at least one current source comprises:
    first and second transistors coupled in series between a supply rail and the respective current source output; and
    a DAC having an output coupled to a node between the first and second transistors.

3. The apparatus of claim 1, wherein the GS stage comprises:
    cross-coupled pairs of transistors configured to form the GS differential input port and the GS differential output port.

4. The apparatus of claim 1, wherein each of the transistors in the GS stage is a FET.

5. The apparatus of claim 1, wherein each of the transistors in the GS stage is a bi-polar transistor.

6. The apparatus of claim 1, wherein an output of the DAC can source or sink current.

7. An apparatus, comprising:
    a main transconductance (MT) stage having an MT differential input port and first and second MT output paths;
    a Gilbert switch (GS) stage, coupled to the first and second MT output paths, comprising a GS differential input port and a GS differential output port;
    a first current source having an output coupled to the first MT output path; and
    a second current source having an output coupled to the second MT output path,
    wherein each of the first and second current sources is configured to generate a respective first and second trickle current at the respective current source output and introduce the generated first and second trickle current into the respective first and second MT output path, and
    wherein each of the first and second current sources comprises:
        first and second PMOS transistors coupled in series between a supply rail and the respective output; and
        a DAC having an output coupled to a node between the first and second transistors.

8. The apparatus of claim 7, wherein the GS stage comprises:
    first and second differential pairs of transistors, wherein common sources of the first and second differential pairs of transistors are coupled to the first and second MT output paths,
    wherein inputs of the first and second differential pairs of transistors are cross-coupled to form the GS differential input port, and
    wherein outputs of the differential pairs of transistors are cross-coupled to form the GS differential output port.

9. The apparatus of claim 7, wherein each of the transistors in the GS stage is a FET.

10. The apparatus of claim 7, wherein each of the transistors in the GS stage is a bi-polar transistor.

11. The apparatus of claim 7, wherein an output of the DAC can source or sink current.

12. The apparatus of claim 7, wherein each of the first and second trickle currents is a cascoded PMOS trickle current.

13. A power detector, comprising:
    an input differential amplifier having a first differential input port and first and second output paths;
    an output differential amplifier having first and second differential pairs of transistors wherein common sources of the differential pairs of transistors are coupled to the first and second output paths, inputs of the differential pairs of transistors are cross-coupled to form a second differential input port and outputs of the differential pairs of transistors are cross-coupled to form a first differential output port;
    a load coupled to the first differential output port;
    a first current source having an output coupled to the first output path;
    a second current source having an output coupled to the second output path,
    wherein each of the first and second current sources is configured to generate a respective first and second trickle current at the respective current source output and introduce the generated first and second trickle current into the respective first and second output path, and
    wherein each of the first and second current sources comprises:
        first and second transistors coupled in series between a supply rail and the respective current source output; and
        a DAC having an output coupled to a node between the first and second transistors.

14. The power detector of claim 13, wherein the output differential amplifier comprises a Gilbert switch stage.

15. The power detector of claim 13, wherein each of the first and second transistors in the first and second current sources is a PMOS transistor.

16. The power detector of claim 15, wherein each of the first and second trickle currents is a cascoded PMOS trickle current.

17. The power detector of claim 13, wherein an output of the DAC can source or sink current.

18. The power detector of claim 13, wherein each of the transistors in the output differential amplifier is a FET.

19. The power detector of claim 13, wherein each of the transistors in the output differential amplifier is a bi-polar transistor.

* * * * *